United States Patent [19]
Hsieh et al.

[11] Patent Number: 5,960,321
[45] Date of Patent: Sep. 28, 1999

[54] METHOD OF FORMING A CONTACT VIA

[75] Inventors: Ching-Hsing Hsieh, Taipei Hsien; Chin-Ching Hsu, Fen Shan; Chen-Chih Tsai, Hsinchu; Jiunn Hsien Lin, Yungkang, all of Taiwan

[73] Assignee: United Microelectronics Corp., Taiwan

[21] Appl. No.: 08/879,199

[22] Filed: Jun. 19, 1997

[30] Foreign Application Priority Data

Dec. 14, 1996 [TW] Taiwan ................................. 85115465

[51] Int. Cl.$^6$ ........................... H01L 21/00; C23C 14/14
[52] U.S. Cl. .......................... 438/699; 438/697; 438/700; 438/760; 438/783; 438/646; 427/527; 427/96
[58] Field of Search .................................... 438/624, 632, 438/646, 783, 760, 629, 637, 697, 698, 699, 700; 427/527, 96

[56] References Cited

U.S. PATENT DOCUMENTS

| | | | |
|---|---|---|---|
| 4,535,528 | 8/1985 | Chen et al. ................................ 29/571 |
| 4,816,115 | 3/1989 | Hoerner et al. .......................... 156/643 |
| 4,918,027 | 4/1990 | Fuse et al. ................................ 437/35 |
| 5,192,697 | 3/1993 | Leong ...................................... 437/37 |
| 5,413,940 | 5/1995 | Lin et al. .................................... 437/7 |
| 5,429,990 | 7/1995 | Liu et al. ................................. 437/190 |
| 5,432,073 | 7/1995 | Wu et al. ................................. 437/195 |
| 5,496,776 | 3/1996 | Chien et al. ............................ 437/231 |

*Primary Examiner*—Shrive Beck
*Assistant Examiner*—Paul Strain
*Attorney, Agent, or Firm*—Rabin & Champagne, P.C.

[57] ABSTRACT

A method of forming a contact via includes forming a wiring, a first insulator layer, and a spin-on glass layer, respectively, over a semiconductor substrate. Fluorine ions are implanted into the spin-on glass layer. A second insulator layer is formed over the spin-on glass layer. The wiring is exposed by patterning the second insulator layer, the spin-on glass layer, and the first insulator layer, respectively.

9 Claims, 4 Drawing Sheets

METHOD OF FORMING A CONTACT VIA

BACKGROUND OF THE INVENTION

1. Field of the Invention

This invention relates to a method of forming a contact via during a metallization process, which avoids contamination of the filling metal.

2. Description of the Related Art

A contact via can be used to connect two different conductive layers together, for example, two metal layers, in an IC (Integrated Circuit) device. The conventional procedure includes forming an inter-metal dielectric (IMD) layer above a first conductive layer. The IMD layer is selectively etched to form the contact via and to expose the first conductive layer. Metal is provided to fill the contact via forming a plug. Finally, a second conductive layer is formed above the IMD layer.

Typically, the IMD layer includes one first insulation layer, one spin-on glass (SOG) layer, and one second insulation layer. However, the SOG layer may lead to the occurrence of an out-gassing phenomenon, due to the generation of moisture after performing an $O_2$ plasma treatment. The out-gassing phenomenon may cause the metal, for example, the aluminum alloy, which fills the contact via to become contaminated. The contaminated metal will have a high resistance, thus adversely affecting the performance of the IC device. Many methods have been proposed to rectify this problem, such as a partial-etch-back (PEB) method proposed by Intel U. S, and an ion implantation method proposed by UMC Taiwan, etc. The ion implantation method may eliminate the problem of contaminated metal, but it may also simultaneously change the structure of the SOG layer.

FIG. 1A is a representation of the atomic structure of the SOG layer. The SOG layer is comprised of siloxane. As shown in FIG. 1B, arsenic (As) ions are implanted using physically-forced replacement of the bond between the silicon atom and the organic function group R, for example, an alkyl group ($CH_3$) or a phenyl group ($C_6H_5$). The function group bonding causes the SOG layer to have a low dielectric constant. However, after implanting of the arsenic ions, the new bonding structure disadvantageously raises the dielectric constant; thus, the original characteristic of a low dielectric constant of the SOG layer is lost.

SUMMARY OF THE INVENTION

In consideration of the aforementioned problem it is an object of the present invention is to provide an implanting ion that will keep the dielectric constant low, or that can compensate for an increased dielectric constant caused by the ion implantation.

It is another object of the present invention to provide a method of making a contact via in which the filling metal is kept pure, and to maintain the original dielectric characteristics of the IMD layer after performing the ion implantation.

The invention achieves the above-identified objects by providing a new method of making a contact via, including forming a wiring, a first insulator layer, and a spin-on glass layer, respectively, over a semiconductor substrate. Fluorine ions are implanted into the spin-on glass layer. A second insulator layer is formed over the spin-on glass layer. The wiring is exposed by patterning the second insulator layer, the spin-on glass layer, and the first insulator layer, respectively.

BRIEF DESCRIPTION OF THE DRAWINGS

Other objects, feature, and advantages of the invention will become apparent from the following detailed description of the preferred but non-limiting embodiment. The description is made with reference to the accompanying drawings in which.

DESCRIPTION OF THE PREFERRED EMBODIMENT

Figure 1A:
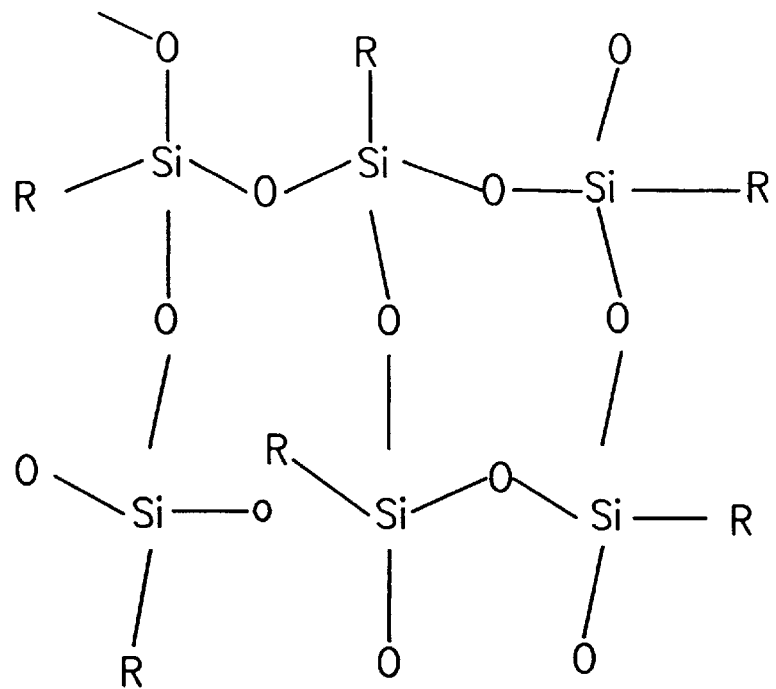
FIGS. 1A and 1B are illustrations of the atomic structure of a known spin-on glass layer.
Figure 1B:
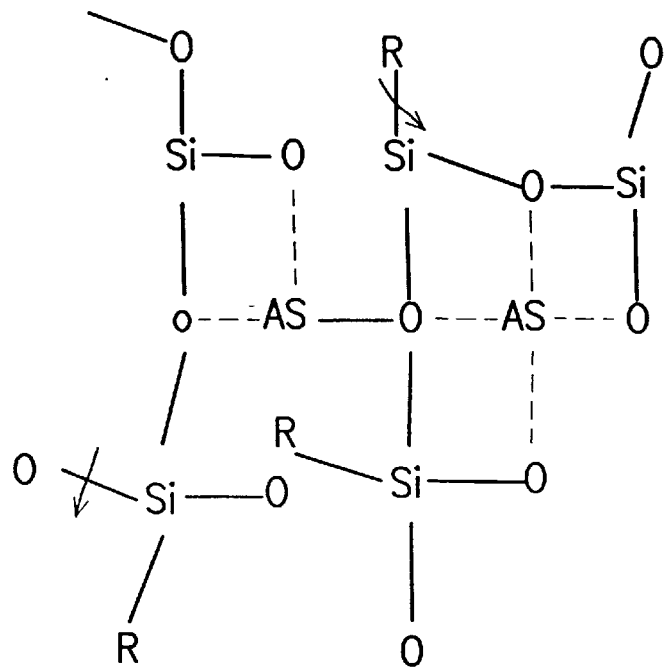
Figure 2A:
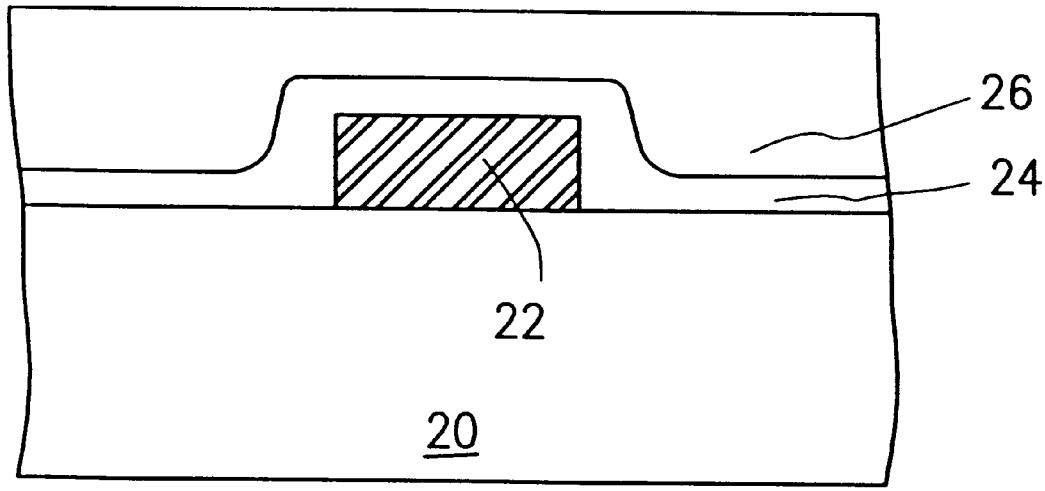
FIGS. 2A, 2B, 2C and 2D are cross-sectional views illustrating the process steps for forming a contact via in accordance with the preferred embodiment of the present invention.

Referring to FIG. 2A, a semiconductor substrate 20 is provided. On the substrate 20, a conductive wiring 22, comprised of, for example, aluminum alloy, is formed using deposition techniques. A first insulator 24 is formed over substrate 20 and wiring 22 using chemical vapor deposition (CVD) techniques. Due to the topography made by the wiring 22, the surface of insulator 24 will be non-planar. Then, a spin-on glass (SOG) layer 26, for example, made by the series of the Allied Signal MSQ, is formed. After the SOG layer 26 is applied, a thermal treatment is performed to cure the SOG layer 26. However, prior to curing, the SOG layer 26 is caused to flow, thus planarizing the layer.

Figure 2B:
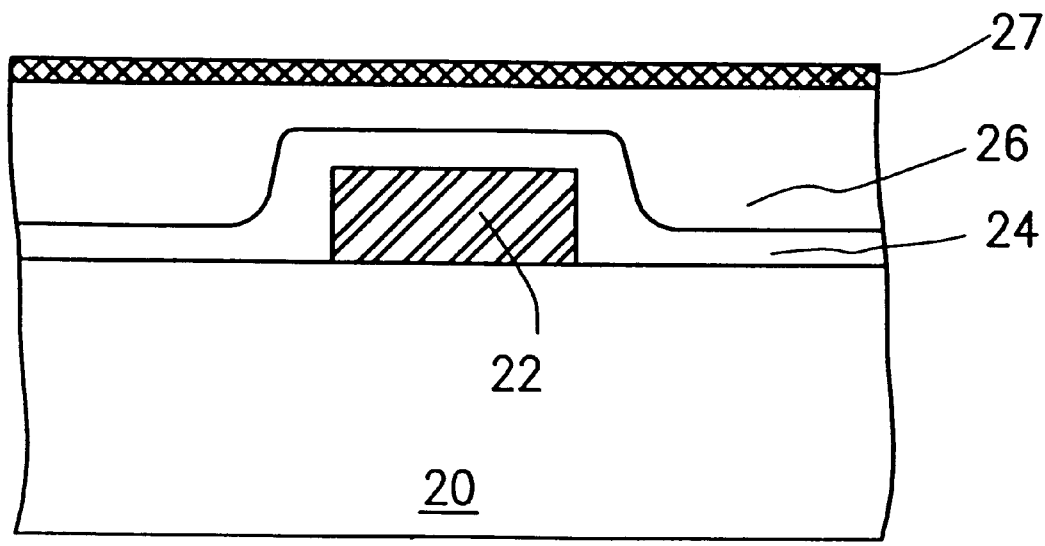

Referring to FIG. 2B, fluorine ions 27 are implanted on the SOG layer 26. For example, boron fluoride ($BF_2$) can be used as the fluorine ion source. The fluorine ions are implanted after the argon ions (Ar), phosphorus irons (P), boron ions (Bn), or arsenic ions (As) are implanted. The implanted fluorine ions are very active ions, and can replace the atoms bonded with the silicon atoms, such as Si—CH3, or Si—O, and bond with the same, to form Si—F. The bond of the fluorine and silicon prevents the contamination of the metal which will be formed later and also maintains the low dielectric constant of the SOG layer 26. The fluorine-silicon bond compensates for the increased dielectric constant caused by the breaking of the original bond between the silicon and the function group R.

Figure 2C:
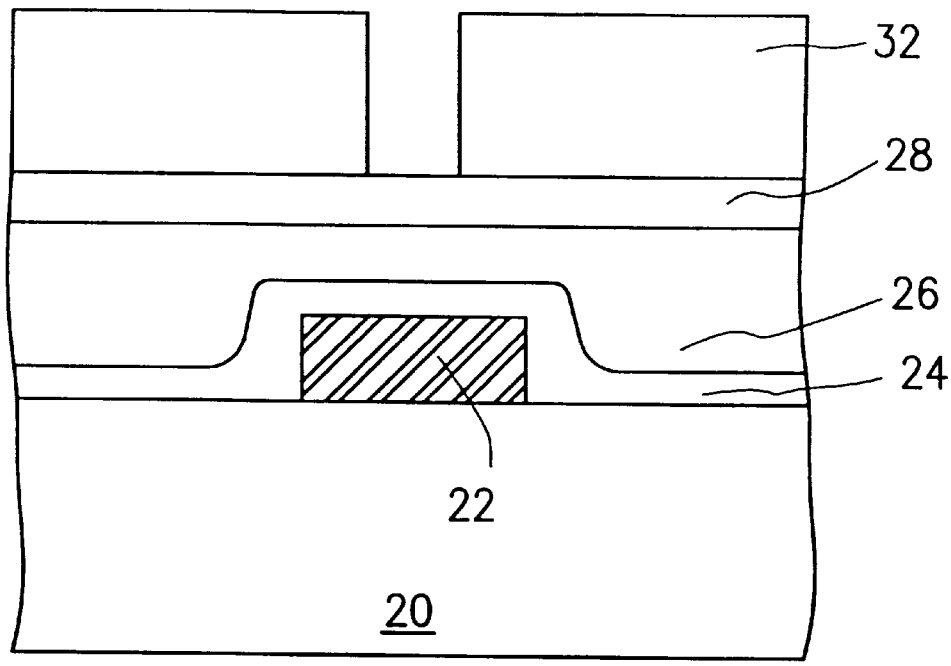

Referring now to FIG. 2C, a second insulator 28 is formed over the SOG layer 26 using a non-etch-back (NEB) method. For example, the second insulator 28 is formed using CVD techniques. Thus, the sandwich-type IMD, comprised of the first insulator 24, the SOG layer 26, and the second insulator 28, is complete. Next, a photoresist layer 32 is formed on top of the second insulator 28, and is patterned to define the regions which will be etched to form the vias.

Figure 2D:
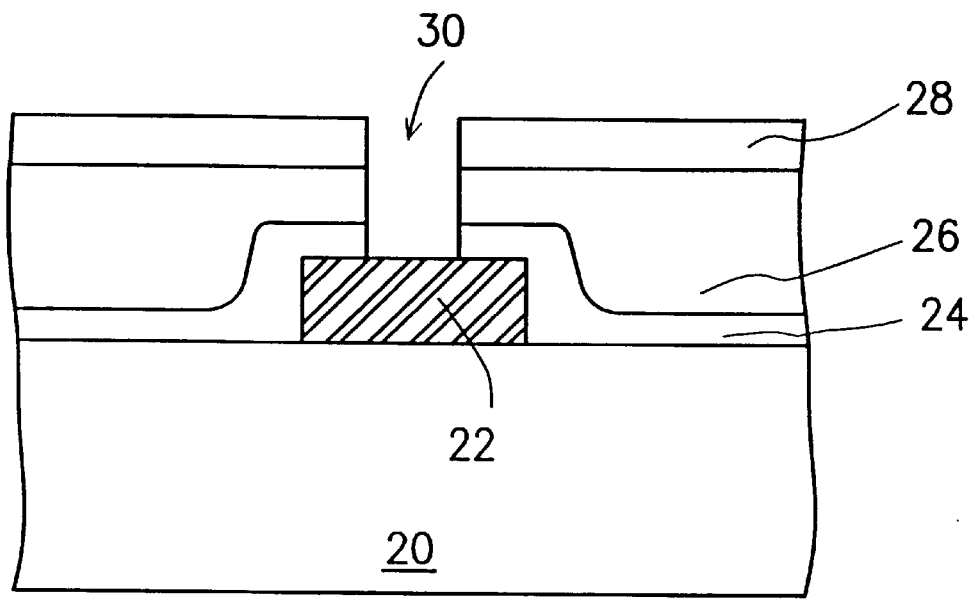

Referring to FIG. 2D, the second insulator 28, the SOG layer 26, and the first insulator 24 are anisotropically etched in turn to form a contact via 30, thus exposing the wiring 22. The etching can be, for example, dry etching performed in accordance with the patterned photoresist layer 32. Then, the photoresist layer 32 is removed.

Figure 3A:
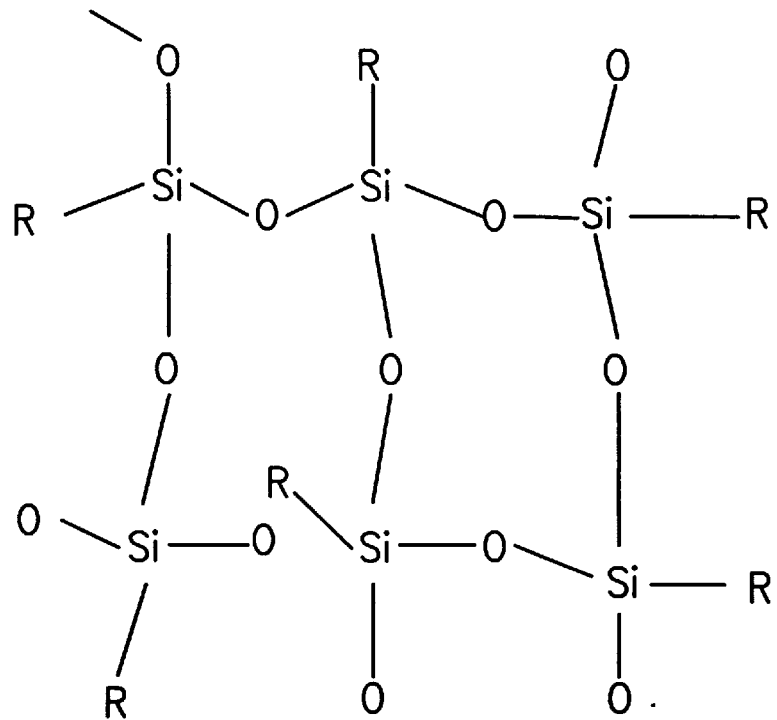
FIGS. 3A and 3B are illustrations of the atomic structure of a spin-on glass layer in accordance with the preferred embodiment of the invention.
Figure 3B:
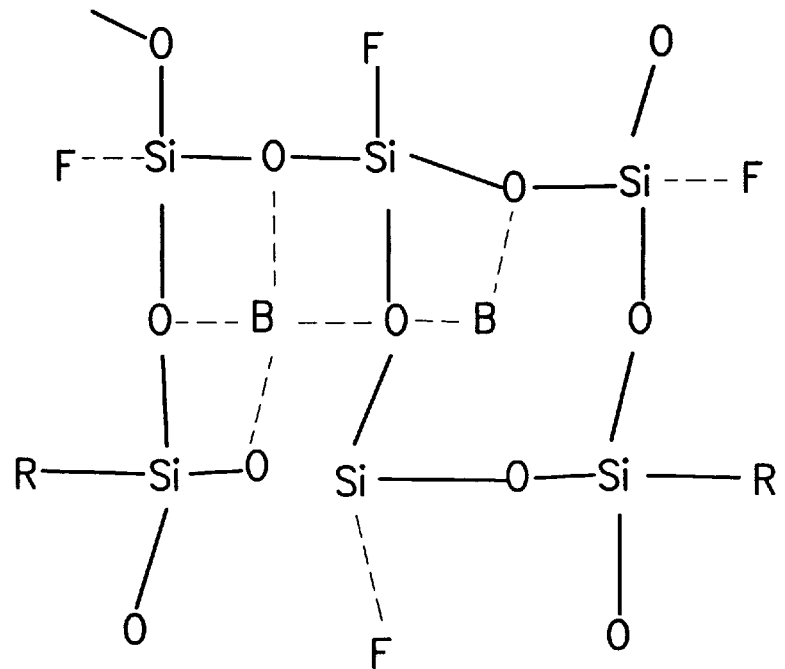

FIGS. 3A and 3B show the atomic structure of the SOG layer 26 prior to implanting the fluorine ions, and after implanting the fluorine ions, in accordance with this invention. These figures show that the fluorine and the silicon bond replaces the bond of the function group R and the silicon. A Fourier transform infrared ray (FT-IR) device can be used to detect the presence of the fluorine and silicon bond.

While the invention has been described by way of example and in terms of a preferred embodiment, it is to be understood that the invention need not be limited to the disclosed embodiment. To the contrary, it is intended to cover various modifications and similar arrangements. The scope of the appended claims, therefore, should be accorded the broadest interpretation so as to encompass all such modifications and similar structures.

What is claimed is:

1. A method of forming a contact via, comprising:

forming a wiring, a first insulator layer, and a spin-on glass layer, respectively, over a semiconductor substrate;

curing the spin-on glass layer by performing a thermal treatment;

implanting, after said performing and prior to implanting fluorine ions, one of argon ions, phosphorus ions, boron ions, and arsenic ions;

implanting, after said curing, fluorine ions into the spin-on glass layer; and exposing the wiring by patterning the second insulator layer, the spin-on glass layer, and the first insulator layer, respectively.

2. The method according to claim 1, further comprising planarizing the spin-on glass layer.

3. The method according to claim 1, further comprising producing the fluorine ions using boron fluoride.

4. The method according to claim 1, wherein the forming a wiring, a first insulator layer, and a spin-on glass layer includes forming the first insulator layer using chemical vapor deposition.

5. The method according to claim 4, wherein the forming a second insulator layer includes forming the second insulator layer using chemical vapor deposition.

6. The method according to claim 1, wherein the patterning the second insulator layer, the spin-on glass layer, and the first insulator layer is performed using dry etching.

7. The method according to claim 1, wherein the one of argon ions, phosphorus ions, boron ions, and arsenic ions comprises phosphorus ions.

8. The method according to claim 1, wherein the one of argon ions, phosphorus ions, boron ions, and arsenic ions comprises boron ions.

9. The method according to claim 1, wherein the one of argon ions, phosphorus ions, boron ions, and arsenic ions comprises arsenic ions.

* * * * *